(12) United States Patent
Pearce et al.

(10) Patent No.: US 6,358,865 B2
(45) Date of Patent: *Mar. 19, 2002

(54) OXIDATION OF SILICON USING FLUORINE IMPLANT

(75) Inventors: Charles Walter Pearce, Emmaus; Daniel Joseph McKee, Allentown; Jeffrey Kenneth Haas, Orefield, all of PA (US)

(73) Assignee: Agere Systems Guardian Corp., Orlando, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,631

(22) Filed: May 14, 1999

(51) Int. Cl.[7] .................. H01L 21/31; H01L 21/469
(52) U.S. Cl. .................. 438/763; 438/981; 438/264
(58) Field of Search .................. 438/981, 440, 438/441, 264, 763

(56) References Cited

U.S. PATENT DOCUMENTS

| | | | |
|---|---|---|---|
| 4,743,563 A | * | 5/1988 | Pfiester et al. |
| 5,480,828 A | * | 1/1996 | Hsu et al. |
| 5,576,226 A | * | 11/1996 | Hwang |
| 5,614,421 A | * | 3/1997 | Yang |
| 5,672,521 A | * | 9/1997 | Barsan et al. |
| 5,902,128 A | * | 5/1999 | Mathews et al. ........... 438/440 |
| 5,937,310 A | * | 8/1999 | Gardner et al. ............. 438/440 |
| 6,087,237 A | * | 7/2000 | Hwang ....................... 438/302 |
| 6,091,109 A | * | 7/2000 | Hasegawa ................... 257/339 |
| 6,150,220 A | * | 11/2000 | Huh et al. ................... 438/275 |

FOREIGN PATENT DOCUMENTS

| | | | |
|---|---|---|---|
| JP | 55085068 | * | 6/1980 |
| JP | 62177930 | * | 8/1987 |
| JP | 03163876 | * | 7/1991 |
| JP | 05074762 | * | 3/1993 |
| JP | 05217931 | * | 8/1993 |
| JP | 07240409 | * | 9/1995 |
| JP | 09055380 | * | 2/1997 |
| JP | 11330263 | * | 5/1998 |

OTHER PUBLICATIONS

Tan Khai Nguyen, et al., Effects of Fluorine Implants on Induced Charge Components in Gate–Oxides Under Constant–Current Fowler–Nordheim Stress, IEEE Transaction on Electron Devices, vol. 44, No. 9, Sep. 1997.

B. Holm et al., Formation of Shallow Donor in Fluorine–Implanted Silicon, J. Appl. Phys. 79 (3), Feb. 1, 1998.

T. P. Chen et al., Investigation on the Distribution of Fluorine and Boron in Polycrystalline Silicon/Silicon Systems, J. Electrochem. Soc., vol. 142, No. 6, Jun. 1995.

Yang–Jlk Park, et al. Fluorine Implantation effect on baron diffusion in Si, Journal of Applied Physics, vol. 85, No. 2, Jan. 15, 1999.

* cited by examiner

Primary Examiner—Richard Booth
(74) Attorney, Agent, or Firm—Dickstein Shapiro Morin & Oshinsky LLP

(57) ABSTRACT

A method is disclosed for the oxidation of a substrate and the formation of oxide regions in the substrate by implantation of fluorine into the silicon lattice and subsequently forming an oxide region by a typical oxide growth process. The oxide growth process may be those such as thermal oxidation or the local oxidation of silicon. The process according to the present invention allows for the simultaneous growth of oxides having different thicknesses at the same time by tailoring the fluorine implantation.

54 Claims, 4 Drawing Sheets

OXIDATION OF SILICON USING FLUORINE IMPLANT

FIELD OF THE INVENTION

The present invention relates a method for the oxidation of silicon and the formation of silicon oxide regions by implantation of fluorine into the silicon lattice and subsequently forming an oxide region by a typical oxide growth process.

BACKGROUND OF THE INVENTION

In the fabrication of a MOS (metal oxide semiconductor) semiconductor device, it is essential to form a gate oxide film by oxidation. The properties of a gate oxide film are greatly influenced by the atmosphere under which the film is formed. Accordingly, an oxide film can be deposited by processes differing from each other in atmospheric conditions. For instance, a silicon oxide film can be deposited by any of the processes belonging to, for example, the families of dry oxidation and wet oxidation. The dry oxidation process comprises supplying a sufficiently dried high purity oxygen to the surface of a hot silicon substrate. In this manner, a silicon oxide film can be formed on the surface of the silicon substrate. The wet oxidation process comprises supplying, to the surface of a silicon substrate, a hot carrier gas containing water vapor. This process also provides a silicon oxide film on the surface of the silicon substrate.

The presence of either chlorine or fluorine in an ambient of dry oxygen is known to accelerate the oxidation rate. It is known that a dry oxidation method to form a silicon oxide film under an oxidizing atmosphere based on a compound containing chlorine (e.g., HCl, $Cl_2$, $CCl_4$, $C_2HCl_3$, $CH_2Cl_2$, and $C_2H_3Cl_3$) or a compound containing a halogen atom other than chlorine provides a silicon oxide film which yields an oxide film thicker than that produced by the dry oxidation method alone. In this regard, fluorine is much more efficient than chlorine. Typically, chlorine is added as a percentage of the total oxygen flow, whereas fluorine on the order of parts-per-million will have a noticeable effect on the oxidation rate.

However, these prior art processes often require additional processing steps, such as annealing, to form a sufficient oxide layer. Additionally, the prior art methods do not allow the growth of the field oxide regions and the gate oxide regions during a single oxide growth step. The present invention overcomes the drawbacks of the prior art methods.

SUMMARY OF THE INVENTION

The present invention relates to method for the oxidation of a semiconductor substrate and the formation of oxide regions or layers by implantation of fluorine into the silicon lattice and subsequently forming an oxide region by a typical oxide growth process. The oxide growth process may be a thermal oxidation process such as dry or wet ambient oxidation processes.

The oxide growth depends upon the amount of fluorine implanted into the substrate, the depth which the fluorine is implanted and the energy at which the fluorine is implanted. The process according to the present invention allows for the simultaneous growth of oxides having different thicknesses at the same time by tailoring the fluorine implantation. Additional advantages of the present invention will be apparent from the detailed description and drawings, which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. The following detailed description is, therefore, not to be taken in a limiting sense, and the scope of the present invention is defined by the appended claims.

The terms "wafer" or "substrate" used in the following description may include any semiconductor-based structure or layer that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions in the base semiconductor or foundation.

Figure 1:
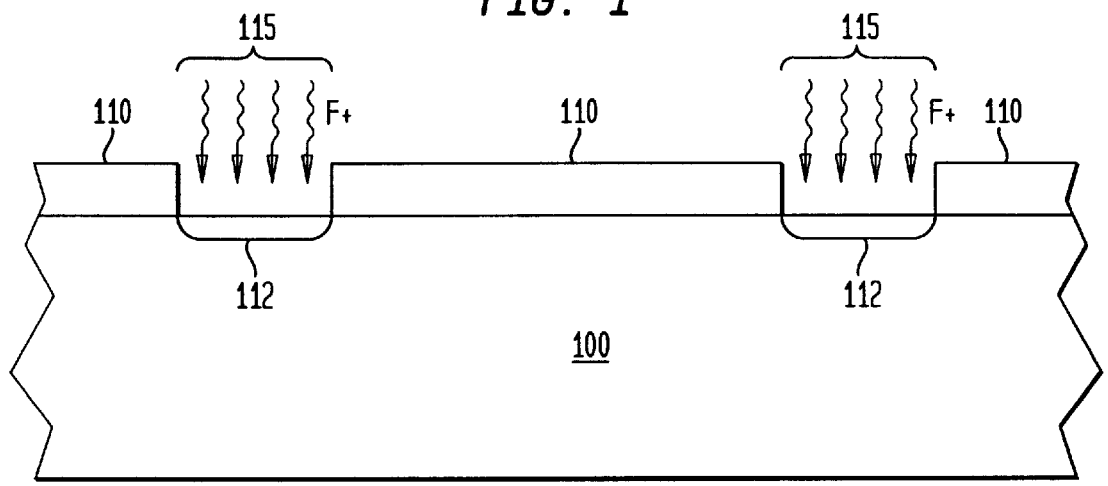
FIG. 1 is a diagrammatic cross-sectional view of a semiconductor wafer according to a first embodiment of the present invention at an intermediate stage of processing.

Referring now to the drawings, where like elements are designated by like reference numerals, a representative substrate formed according to the present invention is illustrated in FIG. 1 A substrate 100 is patterned with a pattern layer 110, preferably a photoresist mask, to create an area in the substrate where field oxide regions 120 will be formed. Fluorine is implanted into the surface of the substrate 100 as indicated by arrows 115. Preferably the fluorine atoms are implanted into the surface of the substrate 100 by ion implantation to form fluorine implant regions 112. The fluorine atoms are implanted using conventional implantation apparatus, such as ion implantation apparatus by methods known to the person having ordinary skill in the art.

The fluorine atoms are implanted into the substrate 100 at an amount of from about $1 \times 10^{11}$ atoms/cm$^2$ to about $5 \times 10^{16}$ atoms/cm$^2$, preferably from about $5 \times 10^{12}$ atoms/cm$^2$ to about $7 \times 10^{15}$ atoms/cm$^2$. The fluorine atoms are implanted at an energy of from about 1 KeV to about 1 MeV, preferably from about 10 KeV to about 50 KeV. The implantation energy together with the amount of fluorine atoms implanted determine the depth of the implantation. These three factors, amount, depth and implant energy, affect the amount of growth of the field oxide region 120.

Figure 2:
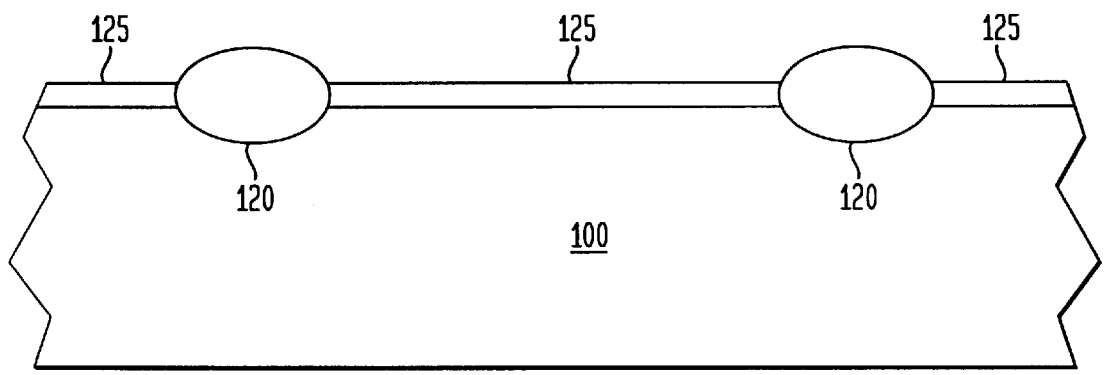
FIG. 2 is a diagrammatic cross-sectional view of a semiconductor wafer according to the present invention at a processing stage subsequent to that shown in FIG. 1.

The patterned layer 110 is removed and the implanted regions 112 of the substrate 100 are then oxidized to grow field oxide region 120 and gate oxide layer 125 is as shown in FIG. 2. Field oxide region 120 will preferably have a thickness of from about 1,000 Å to about 10,000 Å. Gate oxide layer 125 will have a thickness of from about 20 Å to about 1,000 Å, preferably from about 50 Å to about 500 Å. It should be understood that in an alternative embodiment, a second patterned layer (not shown) may be applied over substrate 100 and a fluorine layer may be implanted into the substrate 100 to grow the gate oxide layer 125 in selected regions of the substrate 100.

Figure 3:
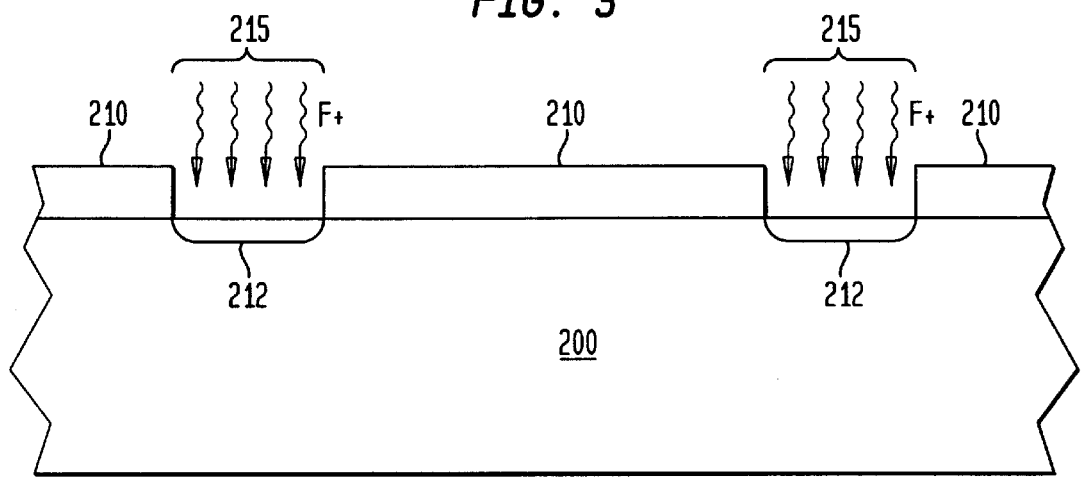
FIG. 3 is a diagrammatic cross-sectional view of a semiconductor wafer according to a second embodiment of the present invention at an intermediate stage of processing.

Referring now made to FIG. 3 which relates to a second embodiment of the present invention A substrate 200 is patterned with a pattern layer 210, preferably a photoresist mask, to create an area in the substrate where the field oxide region 220 (FIG. 5) will be formed. Fluorine is implanted into the surface of the substrate 200 as indicated by arrows 215. Preferably the fluorine atoms are implanted into the surface of the substrate 200 by ion implantation.

The fluorine atoms are implanted into the substrate 200 at an amount of from about $1 \times 10^{11}$ atoms/cm$^2$ to about $5 \times 10^{16}$ atoms/cm$^2$, preferably from about $5 \times 10^{12}$ atoms/cm$^2$ to about $7 \times 10^{15}$ atoms/cm$^2$. The fluorine atoms are implanted at an energy of from about 1 KeV to about 1 MeV, preferably from about 10 KeV to about 50 KeV. The implantation energy together with the amount of fluorine atoms implanted determine the depth of the implantation.

Figure 4:
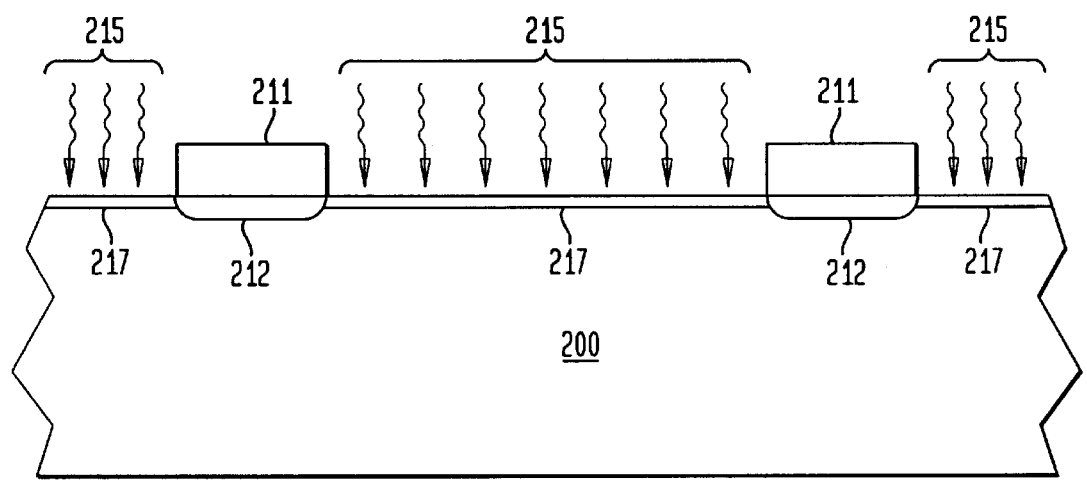
FIG. 4 is a diagrammatic cross-sectional view of a semiconductor wafer according to the present invention at a processing stage subsequent to that shown in FIG. 3.

Reference is made to FIG. 4. The patterned layer 210 is removed. A second pattern layer 211 is applied to the substrate over the implanted regions 212. Fluorine is implanted into the surface of the substrate 210 as indicated by arrows 215. Again, the fluorine atoms are preferably implanted into the surface of the substrate 200 by ion implantation. The fluorine atoms may be implanted into the substrate 200 at an amount of from about $1 \times 10^{11}$ atoms/cm$^2$ to about $5 \times 10^{16}$ atoms/cm$^2$, preferably from about $5 \times 10^{12}$ atoms/cm$^2$ to about $7 \times 10^{15}$ atoms/cm$^2$; however, it is generally understood that the fluorine implantation to form the gate oxide layer 225 (FIG. 5) is implanted at a lower level and to a shallower depth than the fluorine implantation to form field oxide regions 220.

Figure 5:
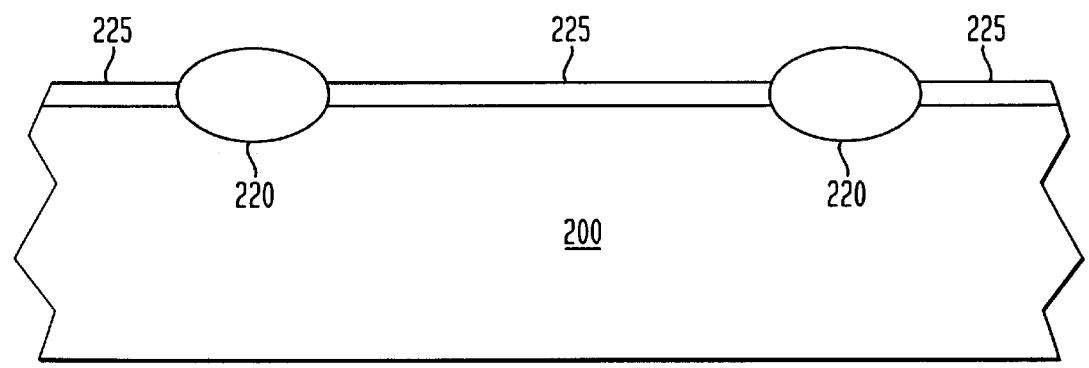
FIG. 5 is a diagrammatic cross-sectional view of a semiconductor wafer according to the present invention at a processing stage subsequent to that shown in FIG. 4.

The patterned layer 211 is removed and implanted regions 212, 217 of the substrate 200 are then oxidized to grow field oxide region 220 and gate oxide layer 225 as shown in FIG. 5. Field oxide region 220 will preferably have a thickness of from about 1,000 Å to about 10,000 Å. Gate oxide layer 225 will have a thickness of from about 20 Å to about 1,000 Å, preferably from about 50 Å to about 500 Å. By using a single oxidation process without the need for a nitride masking layer, the present invention allows the gate oxide layer and the field oxide layer to be grown simultaneously.

The process according to the present invention may also be used to grow gate oxides of different thicknesses allowing circuit operation at different voltages for different parts of the circuit as shown in FIGS. 6–9. It should be understood from these figures that isolation regions may be formed in the device shown in these figures prior to the described processing. While these isolation regions have not depicted here, it is understood that they are within the scope of the present invention.

Figure 6:
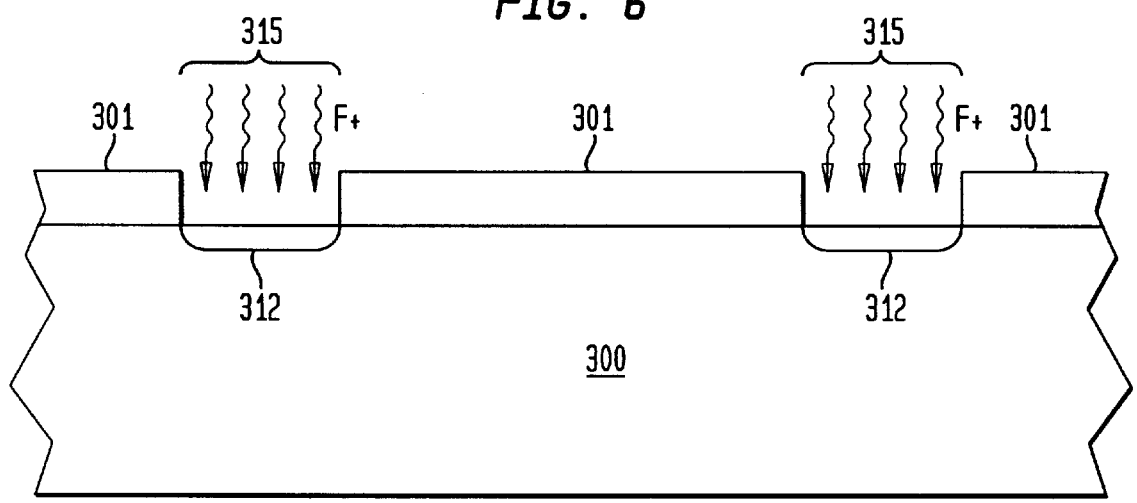
FIG. 6 is a diagrammatic cross-sectional view of a semiconductor wafer according to a third embodiment of the present invention showing gate oxide layers having varying thickness.
Figure 7:
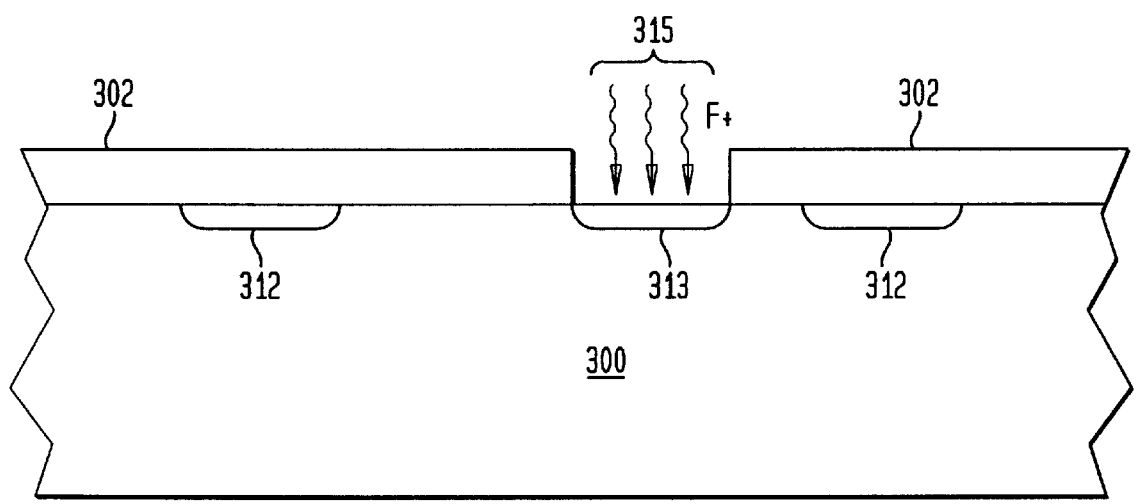
FIG. 7 is a diagrammatic cross-sectional view of a semiconductor wafer according to the present invention at a processing stage subsequent to that shown in FIG. 6.

Reference is made to FIG. 6. To form the gate oxide regions having different thicknesses according to the present invention, a first mask 301 is place over substrate 300 and fluorine is implanted through the openings in the mask 301 at a predetermined dosage and energy level as shown by arrows 315 to form fluorine implantation region 312 as illustrated in FIG. 6. The mask 301 is removed and a second mask 302 is then applied and fluorine is then implanted in the openings in the second mask 302 at a predetermined dosage and energy level as shown by arrows 315 to form fluorine implantation region 313 as illustrated in FIG. 7. It should be understood that the dosage, energy of implantation and depth of implantation may be varied according to the thickness of the field oxide to be grown over substrate 300. While only two masks and corresponding fluorine implant regions have been illustrated, it should be understood that a plurality of masks and regions of varying fluorine implant dosage and depth may be formed according to the present invention.

Figure 8:
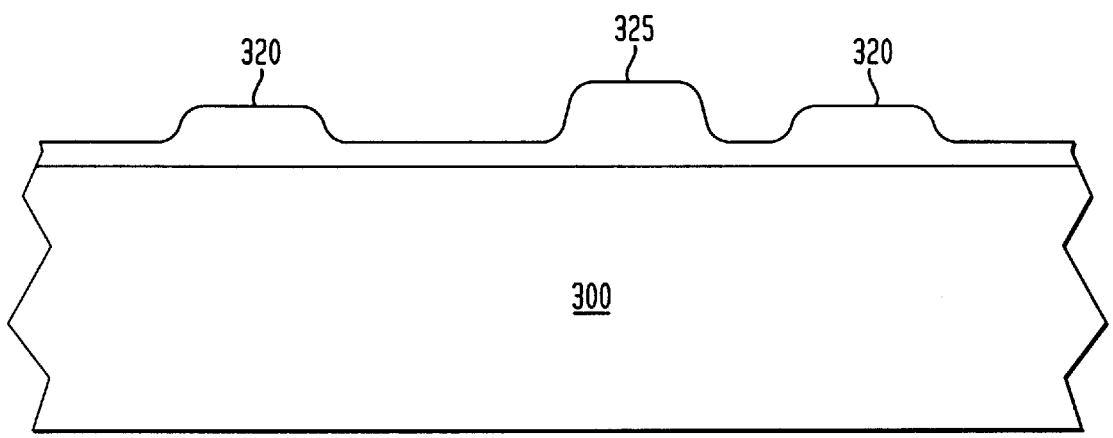
FIG. 8 is a diagrammatic cross-sectional view of a semiconductor wafer according to the present invention at a processing stage subsequent to that shown in FIG. 7.
Figure 9:
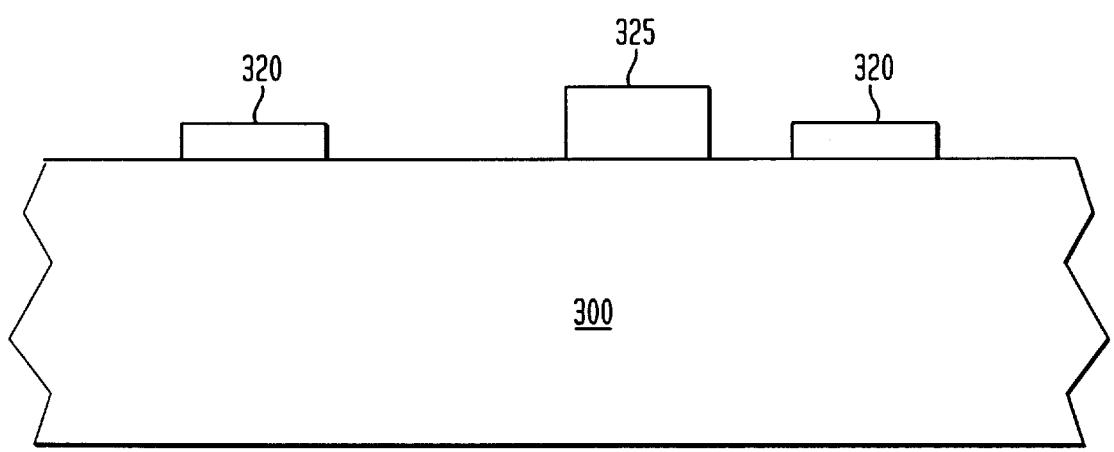
FIG. 9 is a diagrammatic cross-sectional view of a semiconductor wafer according to the present invention at a processing stage subsequent to that shown in FIG. 8.

Reference is made to FIG. 8. The second mask 302 is removed and implanted regions 312, 313 of the substrate 300 are then oxidized using an a conventional thermal oxide process to grow gate oxide region 220, 225 having different thicknesses as shown in FIG. 8. The gate oxide regions 220 225 are then patterned and etched to arrive at the device illustrated in FIG. 9. Gate oxide regions 220, 225 will have a thickness of from about 20 Å to about 1,000 Å, preferably from about 50 Å to about 500 Å. It should be understood that further processing, such as formation of source/drain regions, deposition of further layers and the like may be performed to arrive at an operable integrated circuit device.

The present invention improves over the conventional methods for producing gate and other oxides having different thicknesses. One conventional method uses multiple oxidation steps where the unwanted oxide is removed by wet chemical etching in between the oxidation steps. This process generally results in a lack of control of at least one of the oxidation thicknesses and it is more difficult to control the differential between the desired thicknesses. Another approach is to use a single oxidation step and retard the oxidation of selected areas by nitrogen implantation. The present invention overcomes these shortcomings and produces gate oxides of differing thicknesses in a commercially efficient fabrication process.

The invention is farther explained with reference to the following examples. These examples are merely provided for illustrative purposes and are not to be considered as limiting the invention.

Silicon wafers of (100) orientation and 125 mm diameter were doped with boron to a level of nominally $10^{15}$ atoms/cm$^2$ to arrive at a substrate having a p-type conductivity. The wafers were then implanted with F$^+$ at implant levels from $5 \times 10^{12}$ to $7 \times 10^{15}$ atoms/cm$^2$ as shown in Table 1 below. The implant energy in the examples was varied between about 10 and 50 KeV.

TABLE 1

| IMPLANT | DOPING LEVEL (ions/cm$^2$) | GATE OXIDE THICKNESS (Å) |
|---|---|---|
| Fluorine | 7 × 10$^{15}$ | 162.86 |
| Fluorine | 7 × 10$^{15}$ | 163.17 |
| Fluorine | 5 × 10$^{15}$ | 169.29 |
| Fluorine | 5 × 10$^{15}$ | 169.19 |
| Fluorine | 1 × 10$^{15}$ | 134.21 |
| Fluorine | 1 × 10$^{15}$ | 134.45 |
| Control | Control | 129.94 |
| Control | Control | 130.13 |
| Silicon | 1 × 10$^{15}$ | 131.81 |
| Silicon | 1 × 10$^{15}$ | 132.17 |
| Silicon | 5 × 10$^{15}$ | 133.12 |
| Silicon | 5 × 10$^{15}$ | 132.96 |

The fluorine implanted wafers receiving the various implants were oxidized in one of two processes along with control wafers which were only doped with the boron to form a conductivity type described above. One process used a conventional process used to grow 125 Å oxide layers having an ambient of 98% oxygen and 2% HCl at 850° C. on unimplanted wafers. A second process utilized an ambient of 100% oxygen at a temperature of 750° C.

As can be seen from the Table, the wafers implanted with fluorine exhibited greater growth than the control wafers. In fact, the wafers implanted with fluorine achieved an oxide thickness of up to 40 Å greater than the control wafers. Additionally, the fluorine implanted were also had much greater oxide growth that wafers implanted with silicon ions. These results indicate that it is the fluorine dopant and not merely the presence of a dopant in the interstices of the silicon substrate aided in the unexpected growth of the oxide layer.

The largest differential achieved under these conditions was at an energy of 20 KeV and a dose of 1×10$^{15}$ atoms/cm$^2$ of F$^+$ where the percentage of increase was 28%. Profiles of the Fluorine by Secondary Ion Mass Spectroscopy (SIMS) indicated that, especially at the higher implant energies, only about 1% of the implanted dose was resident in the oxide layer. Thus, based on these results further optimization of dose, energy, and oxidation conditions could result in an oxidation differential of up to 900%. This technique can further be used in conjunction with nitrogen implantation, which is used to inhibit oxidation growth in the nitrogen implantation region, to achieve further oxidation growth differential.

The above illustrates preferred embodiments and examples which achieve the objects, features and advantages of the present invention. It is not intended that the present invention be limited to the illustrated embodiments. For example, while the present invention has been described with reference to a silicon substrate, it should be understood that the present invention may be used in any semiconductor substrate. Additionally, it should be understood that the method described is but one example of the methods that may be used in accordance with the present invention. Any modification of the present invention that comes within the spirit and scope of the following claims should be considered part of the present invention.

What is claimed as new and desired to be protected by Letters Patent of the United States is:

1. A method for forming an oxide on a material layer comprising:
    implanting fluorine into said material layer, wherein a first and a second patterned mask are used so that different areas of the material layer defined by the first and second masks are implanted with different amounts of fluorine, wherein the fluorine implanted into the area of the material layer defined by one of said first and second masks is implanted in a lesser amount and at a shallower depth in said material layer than the fluorine implanted into the area of the material layer defined by the other of said first and second masks; and
    thermally treating said material layer to form an oxide layer, wherein the different areas of the material layer defined by the first and second masks form oxide layers having different thicknesses.

2. The method according to claim 1, wherein said fluorine is implanted by ion implantation.

3. The method according to claim 2, wherein said fluorine is implanted in an amount of from about 1×10$^{11}$ atoms/cm$^2$ to about 5×10$^{16}$ atoms/cm$^2$.

4. The method according to claim 2, wherein said fluorine is implanted in an amount of from about 5×10$^{12}$ atoms/cm$^2$ to about 7×10$^{15}$ atoms/cm$^2$.

5. The method according to claim 2, wherein said fluorine is implanted into said material layer at an energy of from about 1 KeV to about 1 MeV.

6. The method according to claim 2, wherein said fluorine is implanted into said material layer at an energy of from about 10 KeV to about 50 KeV.

7. The method according to claim 1, wherein said material layer is a silicon substrate.

8. The method according to claim 1, wherein said thermal oxidation is a dry or wet ambient process.

9. A method for selectively forming an oxide on a substrate comprising:
    providing a substrate having a first pattern layer thereon;
    implanting a first amount of fluorine to a first depth in said substrate through open areas in said first pattern layer;
    removing said pattern layer;
    forming a second pattern layer on said substrate;
    implanting a second lesser amount of fluorine into a second shallower depth of said substrate through open areas in said second pattern layer; and
    thermally treating said substrate to form an oxide layer, wherein different areas of said substrate defined by the first and second pattern layers receive different amounts of fluorine to form oxide layers having varying thicknesses.

10. The method according to claim 9, wherein said fluorine is implanted by ion implantation.

11. The method according to claim 10, wherein said fluorine is implanted in an amount of from about 1×10$^{11}$ atoms/cm$^2$ to about 5×10$^{16}$ atoms/cm$^2$.

12. The method according to claim 10, wherein said fluorine is implanted in an amount of from about 5×10$^{12}$ atoms/cm$^2$ to about 7×10$^{15}$ atoms/cm$^2$.

13. The method according to claim 10, wherein said fluorine is implanted into said substrate at an energy of from about 1 KeV to about 1 MeV.

14. The method according to claim 10, wherein said fluorine is implanted into said substrate at an energy of from about 10 KeV to about 50 KeV.

15. The method according to claim 9, wherein said substrate is a silicon substrate.

16. The method according to claim 9, wherein said thermal oxidation is a dry or wet ambient process.

17. The method according to claim 9, wherein said oxide is an isolation region.

18. The method according to claim 9, wherein said oxide is a gate oxide layer.

19. A method for forming an isolation region and at least one gate oxide layer on a substrate comprising:

providing a substrate having a first pattern layer thereon;

implanting a first amount of fluorine into a first depth of said substrate through open areas in said pattern layer;

removing said pattern layer;

thermally treating said substrate to form an isolation region;

providing a second pattern layer over said substrate after forming said isolation region and implanting a second amount of fluorine into a second depth of said substrate, wherein said second amount of fluorine is less than said first amount and said second depth is shallower in said substrate than said first depth; and thermally treating said substrate to form said at least one gate oxide layer.

20. The method according to claim 19, wherein said fluorine is implanted by ion implantation.

21. The method according to claim 20, wherein said fluorine is implanted in an amount of from about $1 \times 10^{11}$ atoms/cm$^2$ to about $5 \times 10^{16}$ atoms/cm$^2$.

22. The method according to claim 20, wherein said fluorine is implanted in an amount of from about $5 \times 10^{12}$ atoms/cm$^2$ to about $7 \times 10^{15}$ atoms/cm$^2$.

23. The method according to claim 20, wherein said fluorine is implanted into said substrate at an energy of from about 1 KeV to about 1 MeV.

24. The method according to claim 20, wherein said fluorine is implanted into said substrate at an energy of from about 10 KeV to about 50 KeV.

25. The method according to claim 19, wherein said substrate is a silicon substrate.

26. The method according to claim 19, wherein said fluorine is implanted in an amount of from about $5 \times 10^{12}$ atoms/cm$^2$ to about $7 \times 10^{15}$ atoms/cm$^2$.

27. The method according to claim 26, wherein said fluorine is implanted into said substrate at an energy of from about 10 KeV to about 50 KeV.

28. The method according to claim 26, wherein said at least one gate oxide layer includes gate oxide layers having differing thicknesses wherein said gate oxide layers are implanted with differing levels of fluorine.

29. The method according to claim 19, wherein said at least one gate oxide layer includes gate oxide layers having differing thicknesses wherein said gate oxide layers are implanted with differing levels of fluorine.

30. The method according to claim 19, wherein said thermal oxidation is a dry or wet ambient process.

31. The method according to claim 19, wherein said method includes first thermally treating said substrate to form said isolation region and subsequently treating said substrate to form said gate oxide layer.

32. A method for forming an isolation region and a gate oxide layer on a substrate comprising:

providing a substrate having a first pattern layer thereon;

implanting a first amount of fluorine into said substrate through openings in said first pattern layer using a first implant energy;

removing said first pattern layer;

forming a second pattern layer over said substrate;

implanting a second amount of fluorine into said substrate through openings in said second pattern layer using a second implant energy, wherein said second amount is less than said first amount and said second implant energy is less than said first implant energy;

removing said second pattern layer; and thermally treating said substrate to simultaneously grow an isolation region and a gate oxide layer at least in areas of said substrate implanted with fluorine.

33. The method according to claim 32, wherein said first pattern is to form said isolation region.

34. The method according to claim 32, wherein said fluorine is implanted by ion implantation.

35. The method according to claim 34, wherein said fluorine is implanted in an amount of from about $1 \times 10^{11}$ atoms/cm$^2$ to about $5 \times 10^{16}$ atoms/cm$^2$.

36. The method according to claim 34, wherein said fluorine is implanted in an amount of from about $5 \times 10^{12}$ atoms/cm$^2$ to about $7 \times 10^{15}$ atoms/cm$^2$.

37. The method according to claim 34, wherein said fluorine is implanted into said substrate at an energy of from about 1 KeV to about 1 MeV.

38. The method according to claim 34, wherein said fluorine is implanted into said substrate at an energy of from about 10 KeV to about 50 KeV.

39. The method according to claim 32, wherein said substrate is a silicon substrate.

40. The method according to claim 32, wherein said thermal oxidation is a dry or wet ambient process.

41. A method for forming oxide layers having differing thicknesses on a material layer comprising:

implanting fluorine into said material layer at a first level;

implanting fluorine into said material layer at a second level, wherein said second level is shallower in said material layer than said first level and a lower concentration of fluorine is implanted at said second level than at said first level; and thermally treating said material layer to form said oxide layers, wherein said oxide layers formed by oxidizing said material layer have different thicknesses.

42. The method according to claim 41, wherein said first level is greater than said second level.

43. The method according to claim 1, wherein said fluorine is implanted without annealing.

44. The method according to claim 9, wherein said fluorine is implanted without annealing.

45. The method according to claim 19, wherein said fluorine is implanted without annealing.

46. The method according to claim 32, wherein said fluorine is implanted without annealing.

47. The method according to claim 41, wherein said fluorine is implanted without annealing.

48. The method according to claim 1, wherein said fluorine is implanted without a nitride masking layer.

49. The method according to claim 9, wherein said fluorine is implanted without a nitride masking layer.

50. The method according to claim 19, wherein said fluorine is implanted without a nitride masking layer.

51. The method according to claim 32, wherein said fluorine is implanted without a nitride masking layer.

52. The method according to claim 41, wherein said fluorine is implanted without a nitride masking layer.

53. The method according to claim 32, wherein said gate oxide layer includes gate oxide layers having differing thicknesses.

54. The method according to claim 52, wherein said gate oxide layers are implanted with differing levels of fluorine.

* * * * *